(12) United States Patent
Ahn et al.

(10) Patent No.: US 8,525,166 B2
(45) Date of Patent: Sep. 3, 2013

(54) ZINC-TIN OXIDE THIN-FILM TRANSISTORS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/595,683

(22) Filed: Aug. 27, 2012

(65) Prior Publication Data

US 2012/0319105 A1 Dec. 20, 2012

Related U.S. Application Data

(62) Division of application No. 11/803,261, filed on May 14, 2007, now Pat. No. 8,252,697.

(51) Int. Cl.
*H01L 29/786* (2006.01)

(52) U.S. Cl.
USPC 257/43; 257/213; 257/E29.296; 257/E21.241

(58) Field of Classification Search
USPC .......................................................... 257/43
See application file for complete search history.

(56) References Cited

U.S. PATENT DOCUMENTS

| | | | |
|---|---|---|---|
| 6,884,719 B2 | 4/2005 | Chang et al. |
| 7,101,813 B2 | 9/2006 | Ahn et al. |
| 8,252,697 B2 | 8/2012 | Ahn et al. |
| 2005/0017244 A1 | 1/2005 | Hoffman et al. |
| 2007/0057261 A1 | 3/2007 | Jeong et al. |
| 2007/0114528 A1 | 5/2007 | Herman et al. |
| 2007/0275252 A1 | 11/2007 | Krasnov |
| 2008/0283830 A1 | 11/2008 | Ahn et al. |

OTHER PUBLICATIONS

Chiang, H Q, et al., "High mobility transparent thin film transistors with amorphous zinc tin oxide channel layer", Applied Physics Letter, 86, 013503, (2005), 13503-1 to 13503-3.

Gorrn, Patrick, et al., "Advanced Materials (Weinheim Germany) 18", (2006), 738-41.

Hong, David, et al., "Zinc tin oxide thin-film transistors via reactive sputtering using a metal target", Journal of Vacuum Science & Technology B: Microelectronics and Nanometer Structures, 24(5), (Sep. 2006), L23-L25.

Minami, Tadatsugu, et al., "Highly transparent and conductive zinc stannate thin films prepared by RF magnetron sputtering", Japanese Journal of Applied Physics(33), Part 2, No. 12A, (Dec. 1, 1994), L1693-L1696.

Minami, Tadatsugu, et al., "Properties of transparent zinc stannate conducting films prepared by radio frequency magnetron sputtering", Journal of Vaccuum Science Technology., A13, (1995), 1095-99.

Perkins, J D, et al., "Combinatorial Studies of Zn Al O and Zn Sn O transparent conducting oxide thin films", Thin Solid Films, (2002), 152-60.

Sang, Baosheng, et al., "Growth of transparent conductive oxide ZnO films by atomic layer deposition", Japanese Journal of Applied Physics, 35, (1996), L602-605.

(Continued)

*Primary Examiner* — Angel Roman
(74) *Attorney, Agent, or Firm* — Schwegman, Lundberg & Woessner, P.A.

(57) ABSTRACT

Methods of forming transparent zinc-tin oxide structures are described. Devices that include transparent zinc-tin oxide structures as at least one of a channel layer in a transistor or a transparent film disposed over an electrical device that is at a substrate.

20 Claims, 6 Drawing Sheets

(56) References Cited

OTHER PUBLICATIONS

Sneh, Ofer, "Thin film atomic layer deposition equipment for semiconductor processing", Thin Solid Films, 402(1-2), Preparation and Characterization, Elsevier Sequoia, NL, vol. 402, No. 1-2, (2002), 248-261.

Thein, M. M, "Atomic Layer Deposition", 1-5 pgs, (2006).

Viirola, H, et al., "Controlled growth of tin dioxide thin films by atomic layer epitaxy", Thin Solid Films, 249(2), (Sep. 1994), 144-149.

Young, D L, et al., "Growth and characterization of radio frequency magnetron sputter-deposited zinc stannate, $Zn_2SnO_4$, thin films", Journal of Applied Physics, 92(1), (Jul. 1, 2002), 310-19.

US 8,525,166 B2

ZINC-TIN OXIDE THIN-FILM TRANSISTORS

PRIORITY APPLICATION

This application is a divisional of U.S. application Ser. No. 11/803,261, filed May 14, 2007 now U.S. Pat. No. 8,252,697, which is incorporated herein by reference in its entirety.

TECHNICAL FIELD

This disclosure relates generally to conductive oxide films.

BACKGROUND

Transparent conducting oxides (TCOs) are used in electronic structures where both electrical conduction and optical transparency are required. Some example electronic structures include liquid crystal displays (LCDs), light-emitting diodes (LEDs), solar cells, and others. Zinc tin oxide (ZTO) is used because of high transparency and low resistivity, among other reasons.

Technical challenges exist between scaling down, also known as miniaturization, and acceptable function of a thin-film TCO.

What are needed are methods to form better TCOs that can address these challenges. What are also needed are improved TCO structures that can also address these challenges.

BRIEF DESCRIPTION OF THE DRAWINGS

The previously mentioned issues are addressed by the present disclosure and will be understood by reading and studying the following specification, of which the figures are a part.

DETAILED DESCRIPTION

The embodiments of a device, an apparatus, or an article described herein can be manufactured, used, or shipped in a number of positions and orientations.

Figure 1A:
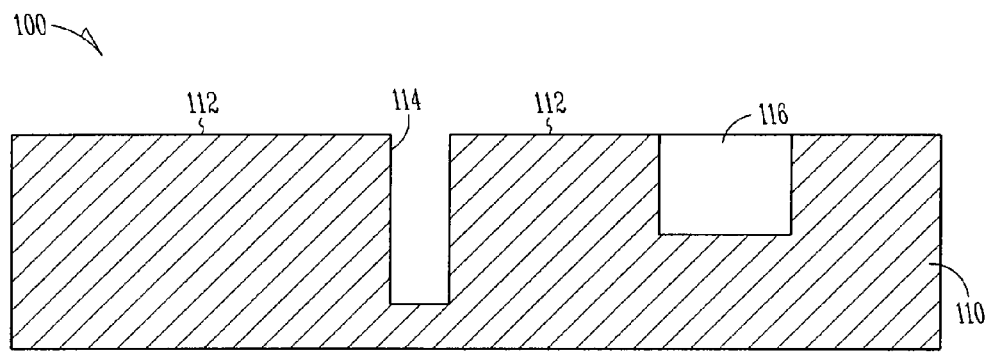
FIG. 1A shows a cross-section elevation of a semiconductor device during processing according to an embodiment.

FIG. 1A is a cross-section elevation of an electrical device 100 that includes a substrate 110 and a surface 112 such as a semiconductor based device. The surface 112 includes variations in surface topology as illustrated by the feature 114, such as a trench. Although the trench 114 is illustrated as an example, other variations in topology, both above and below the surface 112, are useful to describe embodiments.

An electronic device 116 is also shown in block diagram form in FIG. 1A as being disposed in the substrate 110. In an embodiment, the electronic device 116 is disposed on the surface 112 of the substrate 110. In any event, the electronic device 116 is disposed at the substrate. Examples of electronic devices 116 include optical electronic devices such as active pixel sensors, photovoltaic devices, light emitting diode (LED) devices, plasma display screen devices etc. Other electronic devices 116 that benefit from adjacent structures with optical transparency are within the scope of the disclosed embodiments.

Other electronic devices can be formed upon the surface 112, such as an epitaxial channel film for a semiconductive transistor.

Figure 1B:
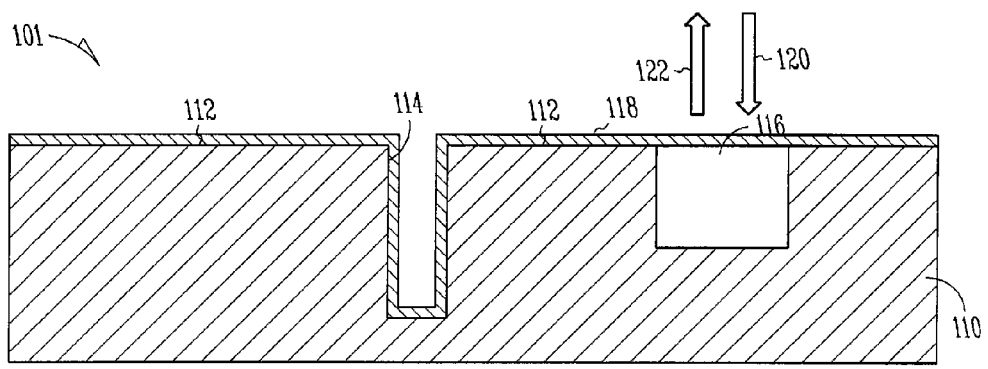
FIG. 1B shows a cross-section elevation of the semiconductor device depicted in FIG. 1A after further processing according to an embodiment.

FIG. 1B is a cross-sectional elevation of the electrical device depicted in FIG. 1A after further processing. The electrical device 101 has been processed with a conformal transparent conducting oxide (TCO) film 118 including zinc and tin over the surface 112. In an embodiment, the TCO film 118 includes a zinc-doped tin oxide film that is formed by atomic layer deposition (ALD) as set forth in this disclosure. In an embodiment, the TCO film 118 includes a tin-doped zinc oxide film that was formed by ALD. In an embodiment, the TCO film 118 includes a zinc-tin oxide film that was formed by ALD.

In an embodiment, a first reactant film of ZnO is formed, followed by a second reactant film of a tin-bearing material. Annealing is used to form a ZnSn TCO film 118. In an embodiment, a first reactant film of SnO is formed, followed by a second reactant film of a zinc-bearing material. Annealing is used to form a ZnSn TCO film 118. In an embodiment, a first reactant film of ZnO is formed, followed by a second reactant film of a tin dielectric compound. Annealing is used to form a ZnSn TCO film 118. In an embodiment, a first reactant film of SnO is formed, followed by a second reactant film of a zinc dielectric compound. Annealing is used to form a ZnSn TCO film 118. In any of these embodiments, the first reactant film can be a chemisorbed tin- or zinc-containing organometallic film monolayer, and the second reactant film can be the other zinc- or tin-containing dielectric that is self-limited in reacting with the chemisorbed first reactant film.

As discussed above, an ALD-formed zinc-tin oxide film provides a number of useful properties over other transparent conducting oxides. Zinc-tin compounds of films provide high carrier mobility, low resistivity, and high transparency among other qualities. Highly mobile carriers are useful because they can be formed in low concentrations to achieve a given electrical resistivity. Low concentrations of carriers in turn provide less optical absorption across many wavelengths. The TCO film 118 is depicted forming a conformal layer over a challenging topology such as the trench 114. The TCO film 118 is also shown covering at least a portion of the electronic device 116.

By use of ALD methods, there are several precursor chemistries that can be used to achieve ALD-formed transparent zinc-tin oxides according to the several disclosed embodiments. Monolayers that contain zinc or tin can be formed, for example, by using at least one of zinc chloride and tin chloride, as well as water as reactants. In an example, a self-limiting growth of a zinc chloride first reactant film is formed by ALD, followed by purging the environment of the substrate and thereafter followed by adsorbing a tin chloride second reactant film upon the zinc chloride first reactant film. Thereafter, processing occurs in a temperature range from about 400° C. to about 500° C. In an example embodiment, a polycrystalline zinc-tin oxide film is formed. Other chemistries and methods are set forth herein. For example, although chlorides of zinc and tin are set forth, either or both of the films may be referred as halide films.

FIG. 1B illustrates an incoming beam 120 of electromagnetic energy such as visible frequency light, ultraviolet (UV) light, infrared light, or other spectra. Selected devices within the scope of the disclosed embodiments include devices such as solar cells, gas sensor components, active pixel sensors, and others that benefit from the ability to receive the incoming beam 120 through a TCO film 118. FIG. 1B also illustrates an outgoing beam 122. Selected devices within the scope of the disclosed embodiments likewise include devices such as light emitting diodes, plasma display screen emitters, and others that benefit from the ability to transmit an outgoing beam through the disclosed embodiments and their equivalents of a TCO film 118. One use of TCOs in conjunction with devices such as these includes interconnection circuitry between devices, to an edge of an array or a chip, to a power supply, etc. Another use of TCOs in conjunction with devices such as these includes conducting layer components of devices themselves, such as a channel layer for a field-effect transistor (FET).

The TCO film 118 is formed using monolayer deposition methods as described in embodiments below. Methods include ALD techniques, chemically self-limiting techniques such as the second reactant is limited with combination with the first reactant. Other techniques that form monolayers with controlled thickness can also be used, such as controlled-atmosphere ALD. As defined above, the term monolayer defines a layer that is substantially one molecule or one atom thick. Although substantially one layer thick, some variation on the order of zero to two molecules is within the scope of the disclosed embodiments.

The methods described form a unique structure compared to other deposition methods. Selected monolayer processing methods can provide a substantially amorphous TCO structure that is not possible using other deposition techniques. Other processing variations provide a fine crystal distribution such as a nanocrystalline TCO structure. Micro-scale and nano-scale crystal structures provide unique physical properties such as highly durable films.

Figure 2A:
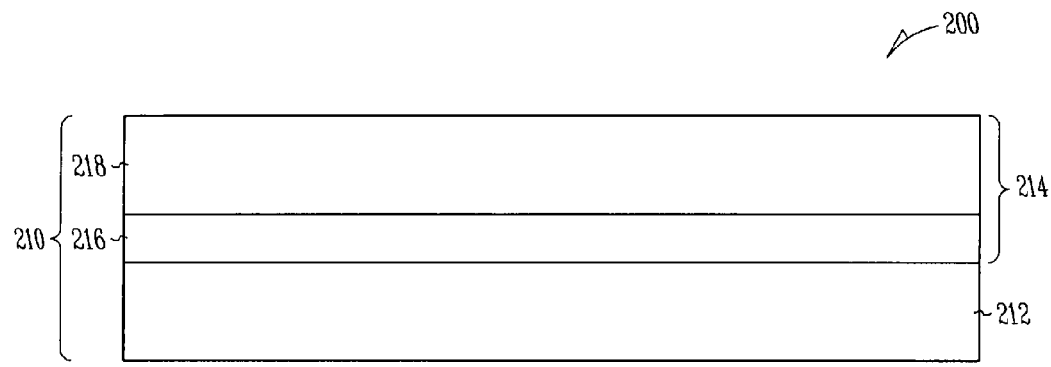
FIG. 2A shows a cross-section elevation of a semiconductor device during processing according to an embodiment.

FIG. 2A shows a cross-section elevation of a semiconductor device 200 during processing according to an embodiment. A substrate 210 including a dielectric base 212 is provided, such as a low-dielectric constant (low-k) dielectric. In an embodiment, the dielectric base 212 is a polyimide material. A semiconductor materials section 214 includes a buried dielectric layer 216 such as a buried oxide that has been formed in monocrystalline silicon by ion implantation. The semiconductor materials section 214 also includes an active section 218 such as vendor-doped monocrystalline silicon, to give the semiconductor materials section 214 either a P-type doping or an N-type doping according to an embodiment.

Figure 2B:
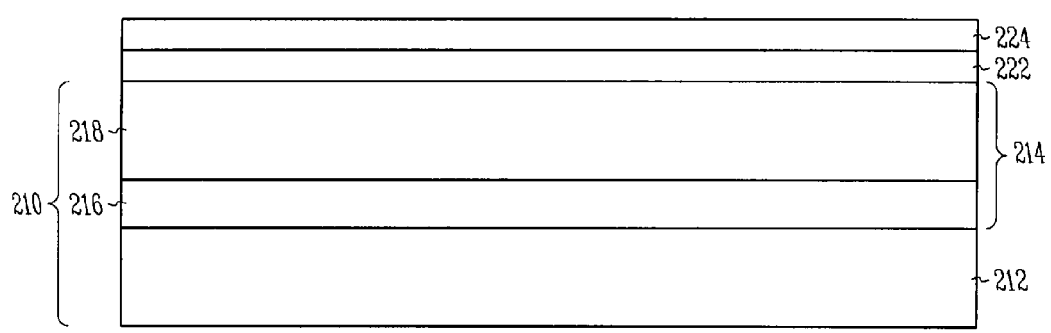
FIG. 2B shows a cross-section elevation of the semiconductor device depicted in FIG. 2A after further processing according to an embodiment.

FIG. 2B shows a cross-section elevation of the semiconductor device depicted in FIG. 2A after further processing according to an embodiment. In a processing embodiment, the semiconductor device 201 exhibits a plurality of chemically adhered monolayers that is formed above the semiconductor materials section 214. A first monolayer 222 has been formed above and on the semiconductor materials section 214. In an embodiment, an ALD process is carried out such that the first monolayer 222, which contains an organometallic molecule, has been chemisorbed onto the semiconductor materials section 214. Thereafter, a subsequent monolayer 224 has been formed above the first monolayer 222.

Figure 2C:
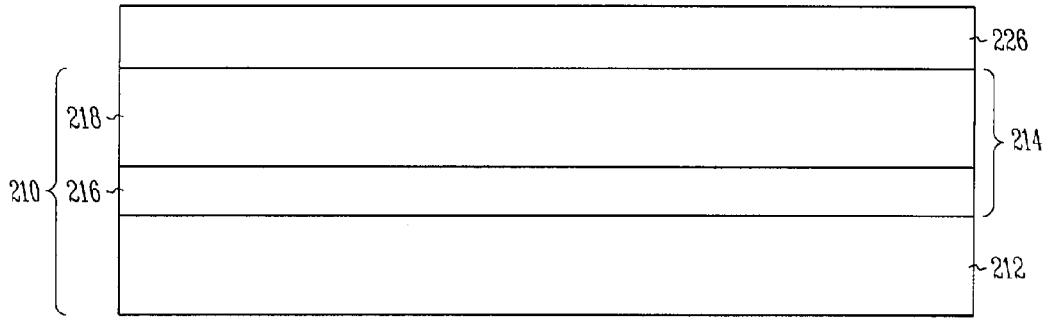
FIG. 2C shows a cross-section elevation of the semiconductor device depicted in FIG. 2B after further processing according to an embodiment.

FIG. 2C shows a cross-section elevation of the semiconductor device depicted in FIG. 2B after further processing according to an embodiment. The semiconductor device 202 exhibits an alloyed result of the plurality of monolayers. In an example embodiment, a zinc-tin TCO film 226 is formed from monolayer precursors into the zinc-tin TCO film 226.

In another example embodiment, an organo-zinc first monolayer (e.g. first monolayer 222 in FIG. 2B) is formed by ALD. A methylcyclopentadinyl trimethylzinc (MeCpZnMe$_3$) composition is flowed into a microelectronic device processing tool along with oxygen and at a temperature of about 300° C. The first monolayer 222, which contains zinc in this embodiment, is allowed to chemisorb onto the semiconductor materials section 214. The process can require about four seconds (s) and the first monolayer 222 is observed to be about 0.45 Ångstrom (Å) in thickness.

Thereafter, the processing tool is purged of the MeCpZnMe$_3$ with a non-reactive gas and an organo-tin subsequent monolayer (e.g. second monolayer 224 in FIG. 2B) is formed above and on the first monolayer 222. A homoleptic N,N"-dialkylactamidinato tin compound is used in the presence of molecular hydrogen gas.

The plurality of two monolayers 222 and 224, are reacted under alloying conditions to form the TCO film 226. The amount of chemisorbed zinc first monolayer 222 can limit the alloying effect.

In an embodiment, the first-reactant and second-reactant precursor layers are formed by multiple alternating ALD repetitions, and the thickness of the TCO film 226 is about 3 Å. In an embodiment, the thickness of the TCO film 226 is in a range from about 3 Å to about 300 Å. In an embodiment, the thickness of the TCO film 226 is in a range from about 10 Å to about 50 Å.

In an embodiment where the composition of the TCO film 226 imparts semiconductive characteristics, the TCO film 226 can be referred to as an epitaxial, transparent semiconductive oxide (TSO) film 226 because it has been formed directly upon the semiconductor materials section 214. In an embodiment, where the composition of the TCO film 226 imparts semiconductive characteristics, the TCO film 226 can be referred to as merely a TSO film 226, where it has not been formed upon a semiconductive section such as upon a dielectric material. Hereinafter for simplicity, the TCO and the TSO embodiments will be referred to generically as "TCO" unless specifically referred to otherwise.

Figure 2D:
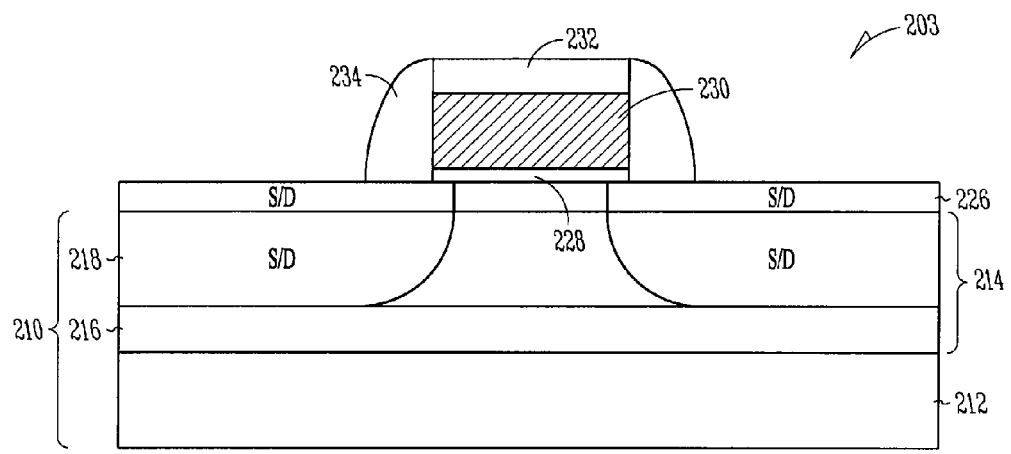
FIG. 2D shows a cross-section elevation of the semiconductor device depicted in FIG. 2C after further processing according to an embodiment.

FIG. 2D shows a cross-section elevation of the semiconductor device depicted in FIG. 2C after further processing according to an embodiment. The semiconductor device 203 has been further processed by forming a gate stack. A gate oxide film 228 is disposed upon the TSO film 226, and a control gate film 230 is formed upon the gate oxide film 228. Further, a dielectric cap film 232 is formed upon the control gate film 230, and a spacer 234 acts to insulate the control gate film 228.

In an embodiment, the gate oxide film 228 is also formed by ALD such that the thickness of the gate oxide film 228 is less than the thickness of the control gate film 230. In an embodiment, the gate oxide film 228 is an oxide such as a silicon oxide. The control gate film 230 can be made from a metal or metal alloy according to an embodiment. In an embodiment, the control gate film 230 is an ALD-formed film, made by the chemisoption of a metal or metal alloy precursor.

FIG. 2D also indicates further processing to form self-aligned source/drain (S/D) regions in the TCO film 226. Further processing, such as forming the spacer dielectrics on the gate stack and bit-line connections to the TCO film 226 can be carried out according to conventional technique. The S/D regions are alternatively shown as being also formed in the active section 218.

Figure 3:
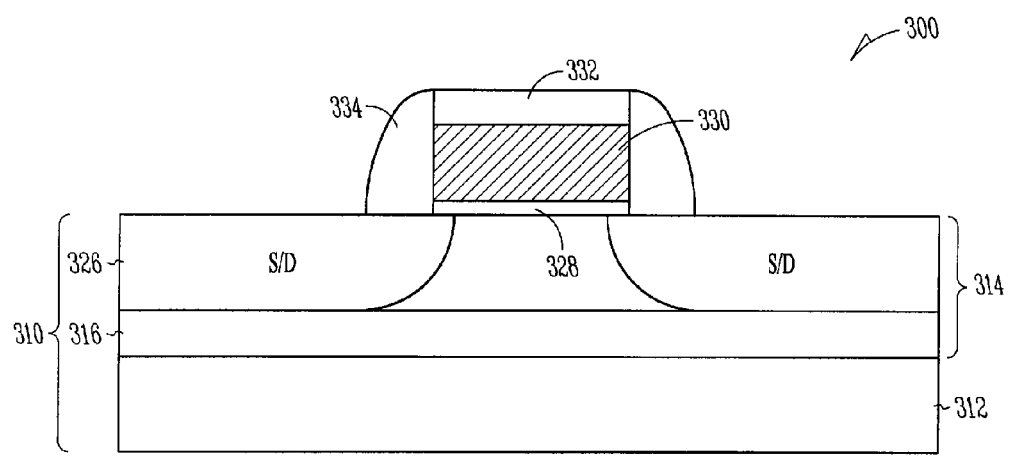
FIG. 3 shows a cross-section elevation of a semiconductor device according to an embodiment.

FIG. 3 shows a cross-section elevation of a semiconductor device 300 according to an embodiment. A substrate 310 including a dielectric base 312 is provided, such as a low-k dielectric. In an embodiment, the dielectric base 312 is a polyimide material. A semiconductor materials section 314 includes a dielectric layer 316, such as an oxide that has been formed in monocrystalline silicon by ion implantation.

The semiconductor device 300 also exhibits an alloyed result of the plurality of monolayers in the semiconductor materials section 314. In an example embodiment, a zinc-tin TCO film 326 is formed from monolayer precursors to achieve the zinc-tin TCO film 326.

In an embodiment the zinc-tin TCO film 326 is in a thickness range from about 3 Å to about 300 Å. In an embodiment, the thickness of the TCO film 326 is in a range from about 10 Å to about 50 Å.

In this embodiment, the composition of the TCO film 226 has semiconductive characteristics; the TSO film 326 can be referred to as channel TSO film 326 because it has acts as a channel film for a field-effect transistor.

A gate oxide film 328 is disposed upon the TSO film 326 and a control gate film 330 is formed upon the gate oxide film 328. Further, a dielectric cap film 332 is formed upon the control gate film 328, and a spacer 334 acts to insulate the control gate film 328.

In an embodiment, the gate oxide film 328 is also formed by ALD such that the thickness of the gate oxide film 328 is less than the thickness of the control gate film 330. In an embodiment, the gate oxide film 328 is an oxide such as a silicon oxide. In an embodiment, the gate "oxide" film is more generically referred to as a gate dielectric film 328, as the film is not limited to oxides. The control gate film 330 can be made from a metal or metal alloy according to an embodiment. In an embodiment, the control gate film 330 is an ALD-formed film, made by the chemisoption of a metal or metal alloy precursor. FIG. 3 also indicates self-aligned S/D regions in the TSO film 326. Further processing, such as forming bit-line connections to the TSO film 326 can be carried out according to conventional technique.

In an embodiment, processing can be done that results in both a TCO film that abuts an electronic device such as the TCO film 118 and electronic device 116 depicted in FIG. 1B, and a TSO film as part of an FET, such as the gate stack depicted in FIG. 3 with the TSO film 326 acting as the channel layer.

The methods described form a unique structure compared to other deposition methods. Using monolayer deposition methods, a TCO film or a TSO film can be formed with step coverage over surface topology that is superior to other deposition techniques. Other processing variations provide a fine crystal distribution such as a nanocrystalline TCO film or TSO film.

Figure 4:
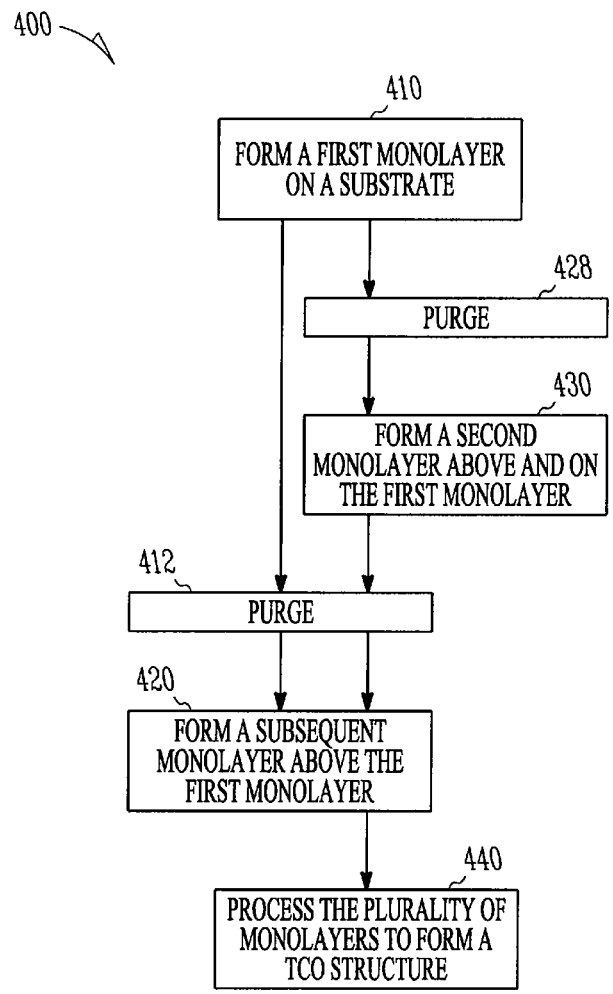
FIG. 4 shows a flow diagram of an example method of forming a zinc-tin oxide thin-film transistor according to an embodiment.

FIG. 4 shows a flow diagram of an example method of forming a zinc-tin oxide thin-film transistor according to an embodiment. In process 410, a monolayer that includes a first TCO film or TSO film precursor is deposited. In an embodiment, the first monolayer is zinc that is chemisorbed.

At 412, a purge of the processing tool is carried out that leaves the first monolayer chemisorbed.

At 420, the process includes forming a subsequent monolayer above the first monolayer. In an embodiment, a tin subsequent monolayer is formed above and on the zinc first monolayer.

At 430 the plurality of monolayers is processed to form a TCO film or TSO film. In the processing embodiment, mixing includes processes such as annealing or diffusion mixing of the various monolayer precursors. In the processing embodiments, the organic materials that carry the selected metals are driven off by either decomposition or volatilization.

At 440 the process includes forming the film into a TSO film. In an embodiment, the TSO film acts as a channel layer in a field-effect transistor. In an embodiment, the TCO film acts as a window through which an electronic device sends or receives radiant energy, such at the electronic device 116 shown in block diagram form in FIG. 1A. An example embodiment of an electronic device includes optical electronic devices. In an example embodiment, the electronic device is an active pixel sensor. In an example embodiment, the electronic device is a photovoltaic device. In an example embodiment, the electronic device is an LED. In an example embodiment, the electronic device is a plasma display screen device. Other light-transmitting or receiving devices are also useful for abutting a TCO film embodiment as set forth in this disclosure.

Figure 5:
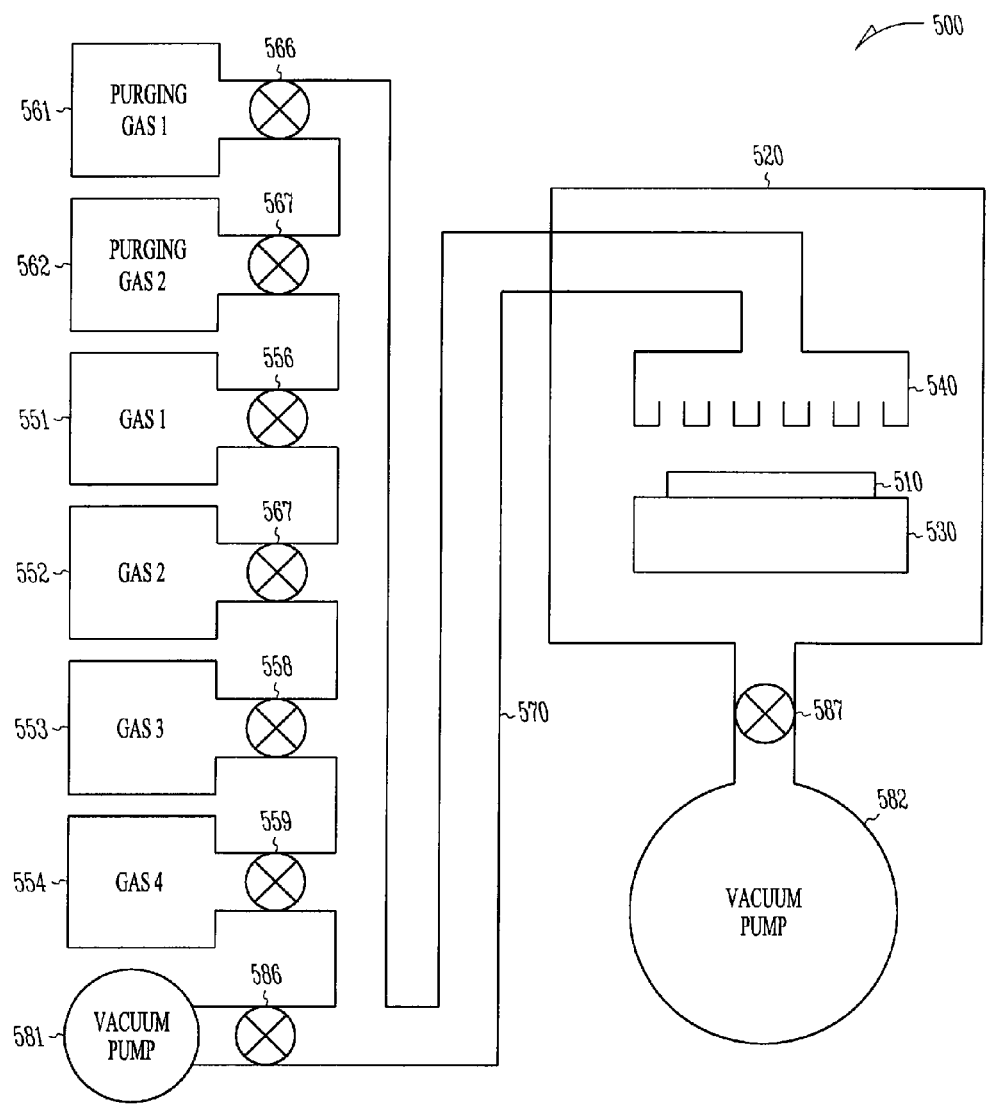
FIG. 5 shows a material deposition system according to an embodiment of the invention.

FIG. 5 shows an embodiment of an ALD system 500 for processing a plurality of monolayers into a TCO film or TSO film according to the teachings of the present invention. The elements depicted are those elements necessary for discussion of the present invention such that those skilled in the art may practice the present invention without undue experimentation. Processing variable such as temperature and pressure, duration, etc. are chosen to reach a desired structure morphology.

In ALD, gaseous precursors are introduced one at a time to the substrate surface mounted within a reaction chamber (or tool). This introduction of the gaseous precursors takes the form of pulses of each gaseous precursor. Between the pulses, the reaction chamber is purged with a gas, which in many cases is an inert gas, or is evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favorable precursor chemistry where the precursors adsorb and react with each other on the substrate aggressively, one ALD cycle can be preformed in less than one second in properly designed flow type reaction chambers. Typically, precursor pulse times range from about 0.5 sec to about two to three seconds.

In ALD, the saturation of all the reaction and purging phases makes the growth self-limiting. This self-limiting growth results in large area uniformity and conformality, which has important applications for applications such as planar substrates, deep trenches, and in material deposition on porous materials, other high surface area materials, powders, etc. Examples include, but are not limited to organometallic TCO film precursors. Significantly, ALD provides for controlling deposition thickness in a straightforward, simple manner by controlling the number of growth cycles. Consequently, a laminate can be formed such that although the first monolayer may be one or two elements of metal thick, a laminate can be formed to achieve thicker TCO structures. In an embodiment, a two-component, e.g., a zinc-tin oxide film is formed, but the zinc-tin oxide film is made from at least three monolayers, one of which is an oxygen-bearing film. In any event, a tin-zinc oxide solid solution is formed such as the zinc-tin TCO film 226 depicted in FIG. 2D.

The precursors used in an ALD process may be gaseous, liquid, or solid. Typically, liquid or solid precursors are volatile. The vapor pressure must be high enough for effective mass transportation. Also, solid and some liquid precursors are heated inside the reaction chamber and introduced through heated tubes to the substrates. The sufficient vapor pressure is reached at a temperature below the substrate temperature to avoid the condensation of the precursors on the substrate. Due to the self-limiting growth mechanisms of ALD, relatively low vapor pressure solid precursors can be used though evaporation rates may somewhat vary during the process because of changes in their surface area.

There are several other considerations for precursors used in ALD. Thermal stability of precursors at the substrate temperature is a factor because precursor decomposition affects the surface control. ALD is heavily dependent upon the reaction of the precursor at the substrate surface. A slight decomposition, if slow compared to the ALD growth, can be tolerated.

The precursors chemisorb on or react with the surface, though the interaction between the precursor and the surface as well as the mechanism for the adsorption is different for different precursors. The molecules at the substrate surface react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction are typically gaseous to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse or chamber evacuation to remove excess precursor and by-products from the reaction chamber prior to pulsing the next precursor of the fabrication sequence.

Using RS-ALD, films can be layered in equal metered sequences that are essentially identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

RS-ALD provides in these embodiments for use of low temperature and oxidizing processes, for growth thickness dependent solely on the number of cycles performed, and an ability to engineer multilayer laminate films with resolution of one to two monolayers.

RS-ALD processes provide for robust deposition of films or other structures. Due to the unique self-limiting surface reaction materials that are deposited using RS-ALD, such films are free from processing challenges such as first wafer effects and chamber dependence. Accordingly, RS-ALD processes are easy to transfer from development to production and from 200 to 300 mm wafer sizes in production lines. Thickness depends solely on the number of cycles. Thickness can therefore be tightly configured by controlling the number of cycles.

Laminate structures of multiple layers formed using ALD can also be subsequently processed to mix the individual layers together. For example, a zinc-tin oxide film laminate structure can be annealed to mix a plurality of different layers together, thus forming an alloy or a solid-solution mixture of layer chemistries. By forming a laminate structure using ALD and subsequently mixing the layers, the chemistry of the resulting structure is precisely controlled. Because the laminate is made up of self-limiting monolayers over a known surface area, the number of molecules from each individual layer are known to a high degree of accuracy. Chemistry can be controlled by adding or subtracting one or more layers in the laminate.

In an embodiment, multiple alternating monolayers are laminated above the deposition substrate before processing.

Referring to FIG. 5, a substrate 510 is located inside a reaction chamber 520 of the ALD tool 500. Also located within the reaction chamber 520 is a heating element 530 that is thermally coupled to substrate 510 to control the substrate temperature. A gas-distribution fixture 540 introduces precursor gases to the substrate 510. Each precursor gas originates from individual gas sources 551 through 554 whose flow is controlled by mass-flow controllers 556 through 559, respectively. The gas sources 551 through 554 provide a precursor gas either by storing the precursor as a gas or by providing a location and apparatus for evaporating a solid or liquid material to form the selected precursor gas.

Also included in the ALD system 500 are purging gas sources 561 and 562, each of which is coupled to mass-flow controllers 566 and 567, respectively. The gas sources 551 through 554 and the purging gas sources 561 through 562 are coupled by their associated mass-flow controllers to a common gas line or conduit 570 that is coupled to the gas-distribution fixture 540 inside the reaction chamber 520. The gas conduit 570 is also coupled to vacuum pump or exhaust pump 581 by a mass-flow controller 586 to remove excess precursor gases, purging gases, and by-product gases at the end of a purging sequence from the gas conduit 570.

A vacuum pump or exhaust pump 582 is coupled by mass-flow controller 587 to remove excess precursor gases, purging gases, and by-product gases at the end of a purging sequence from the reaction chamber 520. For convenience, control displays, mounting apparatus, temperature sensing devices, substrate maneuvering apparatus, and sufficient electrical connections as are known to those skilled in the art are not shown in FIG. 5. Although ALD system 500 is illustrated as an example, other ALD systems may be used.

Although a number of examples of precursors, oxidizers, and process conditions are listed above for ALD forming TCO and TSO structures, the embodiments are not so limited. One of ordinary skill in the art, having the benefit of the present disclosure will recognize that other chemistries and process conditions that form ALD forming TCO and TSO structures can be used.

Figure 6:
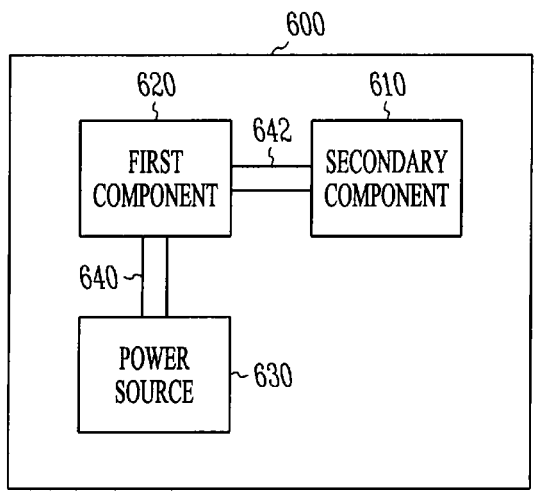
FIG. 6 shows a block diagram of an electronic device according to an embodiment of the invention.

FIG. 6 illustrates an electronic device 600 that includes tin-zinc oxide films formed using monolayer deposition methods such as ALD as described above. The electronic device 600 includes a first component 620 that benefits from tin-zinc oxide films. Examples of first component 620 include dynamic random-access memory arrays. In an embodiment, the first component 620 is a processor that includes flash memory arrays that are used for booting up the processor. In these examples, device operation is improved with the thickness of the TCO structures.

In an embodiment, the device 600 further includes a power source 630. The power source 630 is electrically connected to the first device component 620 using interconnecting circuitry 640. In an embodiment, the interconnecting circuitry 640 includes tin-zinc oxide films formed from monolayers using ALD methods described above. In addition to depositing material as described above, techniques such as lithography with masks and/or etching etc. can be used to pattern conducting circuitry.

In an embodiment, the device 600 further includes a second device component 610. The second component is electrically connected to the first component 620 using interconnecting circuitry 642. Likewise, in one embodiment, the interconnecting circuitry 642 includes tin-zinc oxide films that are formed using methods described above. Examples of second device components 610 include signal amplifiers, flash memory, logic circuitry, or other microprocessing circuits, etc. Aside from interconnecting circuitry, in an embodiment, the first device component 620 and/or the second device component 610 includes tin-zinc TCO films formed as from monolayer precursors using methods described above.

Figure 7:
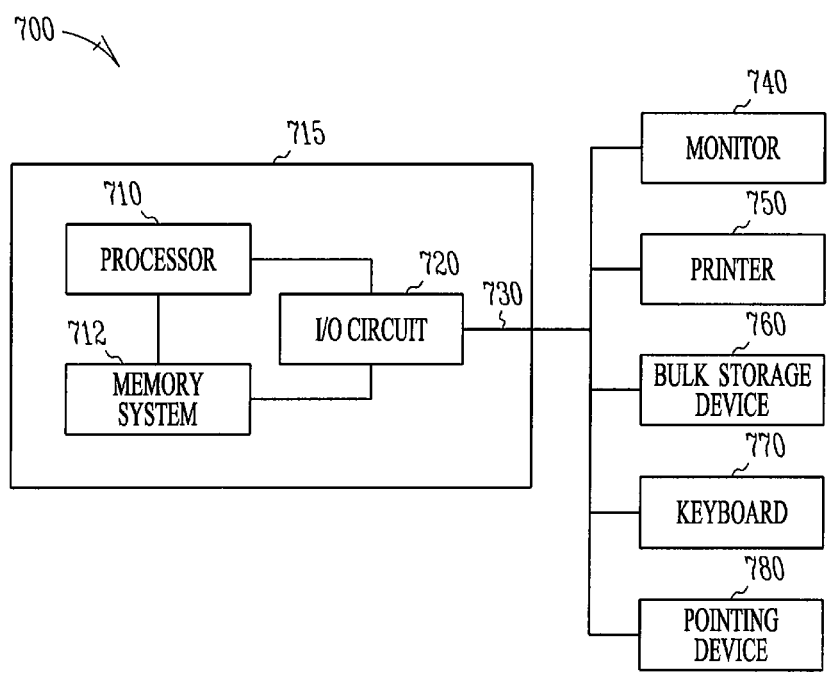
FIG. 7 shows a block diagram of an electronic device according to an embodiment of the invention.

FIG. 7 shows one specific example of a computer system including tin-zinc oxide films formed as described above. The computer system 700 contains a processor 710 and a memory system 712 housed in a computer unit 715. The computer system 700 is but one example of an electronic system containing another electronic system. In an embodiment, the computer system 700 contains an I/O circuit 720 that is coupled to the processor 710 and the memory system 712. In an embodiment, the computer system 700 contains user interface components that are coupled to the I/O circuit 720. In an embodiment, a tin-zinc oxide film is coupled to one of a plurality of I/O pads or pins 730 of the I/O circuit 720. The I/O circuit 720 can then be coupled to at least one of a monitor 740, a printer 750, a bulk storage device 760, a keyboard 770, and a pointing device 780. It will be appreciated that other components are often associated with the computer system 700 such as modems, device driver cards, additional storage devices, etc. It will further be appreciated that the processor 710, the memory system 712, the I/O circuit 720, and partially isolated structures or data storage devices of computer system 700 can be incorporated on a single integrated circuit. Such single package processing units may reduce the communication time between the processor 710 and the memory system 700.

This Detailed Description refers to the accompanying drawings that show, by way of illustration, specific aspects and embodiments in which the present disclosure may be practiced. These embodiments are described in sufficient detail to enable those skilled in the art to practice the disclosed embodiments. Other embodiments may be used and structural, logical, and electrical changes may be made without departing from the scope of the present disclosure. The various embodiments are not necessarily mutually exclusive, as some embodiments can be combined with one or more other embodiments to form new embodiments.

The Detailed Description is, therefore, not to be taken in a limiting sense, and the scope of this disclosure is defined only by the appended claims, along with the full scope of equivalents to which such claims are entitled.

The terms "wafer" and "substrate" used in the description include any structure having an exposed surface with which to form an electronic device or device component such as a component of an integrated circuit (IC). The term substrate is understood to include semiconductor wafers. The term substrate is also used to refer to semiconductor structures during processing and may include other layers such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art.

The term conductor is understood to include semiconductors and the term insulator or dielectric is defined to include any material that is less electrically conductive than the materials referred to as conductors.

The term transparent is defined as a property of a material that transmits a substantial portion of incident electromagnetic energy in a given frequency range. Examples of electromagnetic energy ranges include visible frequency light, infrared, ultraviolet, etc. or combinations of frequency ranges.

The term monolayer is defined as a material layer that is substantially one molecule thick. In some embodiments, one molecule includes one atom, while other molecules are comprised of several atoms. The term monolayer is further defined to be substantially uniform in thickness, although slight variations of between approximately zero to two monolayers results in an average of a single monolayer as used in description below.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The Abstract is provided to comply with 37 C.F.R. §1.72 (b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

What is claimed is:

1. An electrical device, comprising:
   a first device component;
   a second device component coupled to the first device component; and
   a transparent zinc-tin oxide structure disposed in one of the first and second device component, wherein the transparent zinc-tin oxide structure is formed by a method including:
      atomic layer depositing a first monolayer;
      atomic layer depositing a second monolayer; and
      processing the monolayers to form a transparent zinc-tin oxide chemical mixture of the monolayers.

2. The electrical device of claim 1, wherein the first device component includes a field-effect transistor component.

3. The electrical device of claim 1, wherein the second device component includes a field-effect transistor component.

4. The electrical device of claim 1, wherein the transparent zinc-tin oxide of the chemical mixture is disposed as a channel layer in a field effect transistor.

5. The electrical device of claim 1, wherein the chemical mixture has a thickness in a range from about 3 Å to about 300 Å.

6. An optical electronic device, comprising:
an array of pixels;
a transparent zinc-tin oxide structure electrically connecting components in the array of pixels, wherein the transparent zinc-tin oxide structure is formed by a method including:
atomic layer depositing a first monolayer;
atomic layer depositing at a second monolayer; and
processing the monolayers to form a transparent zinc-tin oxide chemical mixture of the monolayers.

7. The optical electronic device of claim 6, wherein the array of pixels are included in a touch screen device.

8. The optical electronic device of claim 6, wherein the array of pixels are included in an active pixel sensor.

9. The optical electronic device of claim 6, wherein the array of pixels are included in an LED device.

10. The optical electronic device of claim 6, wherein the chemical mixture has a thickness in a range from about 3 Å to about 300 Å.

11. The optical electronic device of claim 6, wherein the chemical mixture has a thickness of about 3 Å.

12. The optical electronic device of claim 6 wherein the chemical mixture has a thickness in a range from about 10 Å to about 50 Å.

13. An electrical device, comprising:
a transistor formed on a semiconductor substrate
a transparent zinc-tin oxide structure electrically coupled to a component of the transistor, wherein the transparent zinc-tin oxide structure is formed by a method including:
atomic layer depositing a first monolayer;
atomic layer depositing a second monolayer; and
processing the monolayers to form a transparent zinc-tin oxide chemical mixture of the monolayers.

14. The electrical device of claim 13, wherein the transparent zinc-tin oxide structure is coupled directly to a source/drain region of the transistor.

15. The electrical device of claim 13, wherein the transparent zinc-tin oxide structure is an epitaxial transparent zinc-tin oxide structure.

16. The electrical device of claim 13, wherein at least a portion of the transparent zinc-tin oxide structure is formed over a dielectric region of the electrical device.

17. The electrical device of claim 13, wherein at least a portion of the transparent zinc-tin oxide structure is a channel layer in the transistor.

18. The electrical device of claim 13, wherein the chemical mixture has a thickness in a range from about 3 Å to about 300 Å.

19. The electrical device of claim 13, wherein the chemical mixture has a thickness of about 3 Å.

20. The electrical device of claim 13 wherein the chemical mixture has a thickness in a range from about 10 Å to about 50 Å.

* * * * *